United States Patent
Fujikawa

(10) Patent No.: US 11,111,599 B2
(45) Date of Patent: *Sep. 7, 2021

(54) SINGLE CRYSTAL GROWTH METHOD WHICH INCLUDES COVERING A PART OF A SURFACE OF A RAW MATERIAL FOR SUBLIMATION WITH A METAL CARBIDE POWDER

(71) Applicant: SHOWA DENKO K.K., Tokyo (JP)

(72) Inventor: Yohei Fujikawa, Hikone (JP)

(73) Assignee: SHOWA DENKO K.K., Tokyl (JP)

( * ) Notice: Subject to any disclaimer, the term of this patent is extended or adjusted under 35 U.S.C. 154(b) by 63 days.

This patent is subject to a terminal disclaimer.

(21) Appl. No.: 16/559,875

(22) Filed: Sep. 4, 2019

(65) Prior Publication Data

US 2020/0080229 A1    Mar. 12, 2020

(30) Foreign Application Priority Data

Sep. 6, 2018   (JP) .............................. JP2018-167063

(51) Int. Cl.
*C30B 23/06* (2006.01)
*C30B 29/60* (2006.01)
(Continued)

(52) U.S. Cl.
CPC .......... *C30B 23/066* (2013.01); *C30B 23/002* (2013.01); *C30B 23/005* (2013.01); *C30B 29/36* (2013.01); *C30B 29/60* (2013.01)

(58) Field of Classification Search
CPC ..... C30B 23/00; C30B 23/002; C30B 23/005; C30B 23/02; C30B 23/06; C30B 23/066;
(Continued)

(56) References Cited

U.S. PATENT DOCUMENTS

2001/0004877 A1* 6/2001 Shigeto ................... C30B 23/02
                                                    117/84
2020/0080233 A1* 3/2020 Fujikawa ................ C30B 23/02

FOREIGN PATENT DOCUMENTS

CN         1554808 A    12/2004
CN       104246023 A    12/2014
(Continued)

OTHER PUBLICATIONS

A. Pisch, et al. publication entitled "Evaporation behavior of SiC powder for single crystal growth—an experimental study on thermodynamics and kinetics," Materials Science Forum, vol. 338-342, pp. 91-94 (2000). (Year: 2000).*

(Continued)

*Primary Examiner* — Kenneth A Bratland, Jr.
(74) *Attorney, Agent, or Firm* — Sughrue Mion, PLLC

(57) ABSTRACT

The present invention provides a single crystal growth method capable of suppressing the recrystallization of the raw material gas subjected to sublimation on the surface of the raw material, and suppressing the generation of different polytypes in the crystal growing single crystal. The single crystal growth method is carried out in a crucible comprising an inner bottom for providing a raw material and a crystal mounting part facing the inner bottom. The method comprises in the following order: providing the raw material in the inner bottom; covering at least a part of a surface of the raw material with a metal carbide powder in a plan view from the crystal mounting part; and growing a single crystal disposed in the crystal mounting part by sublimating the raw material by heating.

8 Claims, 2 Drawing Sheets

(51) Int. Cl.
*C30B 29/36* (2006.01)
*C30B 23/00* (2006.01)

(58) Field of Classification Search
CPC ......... C30B 29/00; C30B 29/10; C30B 29/36; C30B 29/60; C30B 35/00; C30B 35/002; C23C 14/06; C23C 14/0635
USPC ....... 117/84, 88–89, 93, 102, 105, 200, 204, 117/937, 951
See application file for complete search history.

(56) References Cited

FOREIGN PATENT DOCUMENTS

| | | |
|---|---|---|
| CN | 105734671 A | 7/2016 |
| CN | 207498521 U | 6/2018 |
| JP | 06001698 A * | 1/1994 |
| JP | 2000-264795 A | 9/2000 |
| JP | 2010-275166 A | 12/2010 |
| JP | 2011-178590 A | 9/2011 |
| JP | 2012-020893 A | 2/2012 |
| TW | 201504488 A | 2/2015 |
| WO | WO-2019171901 A1 * | 9/2019 ............. C30B 23/02 |

OTHER PUBLICATIONS

Office Action dated Dec. 30, 2020 in Chinese Application No. 201910751559.0.
Communication dated Jan. 7, 2021 from the China National Intellectual Property Administration in related Application No. 201910772738.2.
Restriction Requirement dated Feb. 25, 2021 in related U.S. Appl. No. 16/559,863.
Office Action dated Jun. 14, 2021 issued in related U.S. Appl. No. 16/559,863.

* cited by examiner

SINGLE CRYSTAL GROWTH METHOD WHICH INCLUDES COVERING A PART OF A SURFACE OF A RAW MATERIAL FOR SUBLIMATION WITH A METAL CARBIDE POWDER

BACKGROUND OF THE INVENTION

Field of the Invention

The present invention relates to a single crystal growth method.

Priority is claimed on Japanese Patent Application No. 2018-167063, filed Sep. 6, 2018, the content of which is incorporated herein by reference.

Description of Related Art

Silicon carbide (SiC) has a dielectric breakdown electric field that is an order of magnitude larger than that of silicon (Si), and has a band gap that is three times as wide as that of silicon (Si). In addition, silicon carbide (SiC) has a thermal conductivity that is about three times higher than silicon (Si). As a result, silicon carbide (SiC) is expected to be applied to power devices, high frequency devices, high temperature operation devices, and the like.

For devices such as semiconductors, a SiC epitaxial wafer in which an epitaxial film is formed on a SiC wafer is used. An epitaxial film provided by chemical vapor deposition (CVD) on a SiC wafer is an active area of the SiC semiconductor device. The SiC wafer is obtained by processing a SiC ingot.

The SiC ingot can be produced by a method such as a sublimation recrystallization method (hereinafter referred to as a sublimation method). The sublimation method is a method of obtaining a large single crystal by recrystallizing a raw material gas sublimated from a raw material on a seed crystal. In order to obtain a high quality SiC ingot, a method for suppressing defects and different polytypes (in which crystals of different polytypes are mixed) is required.

Patent Document 1 discloses a method of controlling the ratio of C to Si (C/Si ratio) of the source gas on the crystal growth surface and suppressing defects and different polytypes by adding a Si source to the surface of the SiC source.

PATENT DOCUMENT

[Patent Document 1] Japanese Unexamined Patent Application, First Publication No. 2010-275166

SUMMARY OF THE INVENTION

However, different polytypes may be contained in a grown single crystalline, and a method capable of further suppressing heteromorphism is desired.

The present invention has been made in view of the above problems, and it is possible to suppress the recrystallization of the raw material gas subjected to sublimation from being recrystallized on the surface of the raw material, and to suppress the generation of different polytypes in the single crystal to be grown. It is an object of the present invention to provide a single crystal growth crucible and single crystal growth method.

The present inventors have found that when deposition is generated on the surface of the raw material after crystal growth, different polytypes are likely to occur in the grown single crystal. The deposition is considered to be obtained from recrystallization of the sublimated source gas by using the source powder as nuclei. Therefore, the use of metal carbide to cover the surface of the raw material from which the depositions are generated was studied, and it was found that the metal carbide is also less likely to cause adsorption of SiC. As a result, it has been found that it is possible to suppress the nucleus growth of a part of the source gas, suppress the generation of depositions, and suppress the generation of different polytypes in the single crystal to be grown.

That is, the present invention provides the following means in order to solve the above problems.

(1) A single crystal growth method according to the first aspect, in a crucible comprising an inner bottom for providing a raw material and a crystal mounting part facing the inner bottom, the method comprising in the following order:
providing the raw material in the inner bottom;
covering at least a part of the surface of the raw material with a metal carbide powder in a plan view from the crystal mounting part; and
growing a single crystal disposed in the crystal mounting part by sublimating the raw material by heating.

(2) In the covering step of the single crystal growth method according to the above aspect, an area covered with the metal carbide powder includes a central area of the surface of the raw material, and
the central area is an area of 20 area % from a center of the surface of the raw material.

(3) In the covering step of the single crystal growth method according to the above aspect, the metal carbide powder covers the entire surface of the raw material.

(4) In the single crystal growth method according to the above aspect, a particle diameter of the metal carbide powder is 0.1 mm or more and 2.0 mm or less.

(5) In the single crystal growth method according to the above aspect, the metal carbide powder is a tantalum carbide powder.

(6) In the single crystal growth method according to the above aspect, an average thickness of the covered area made of the metal carbide powder in the covering step is 1.0 mm or more and 30 mm or less.

According to the single crystal growth crucible and the single crystal growth method according to the above aspect, it is possible to suppress the recrystallization of the raw material gas subjected to sublimation from recrystallization on the surface of the raw material and to suppress the generation of different polytypes in the single crystal to be grown.

DETAILED DESCRIPTION OF THE INVENTION

Figure 1:
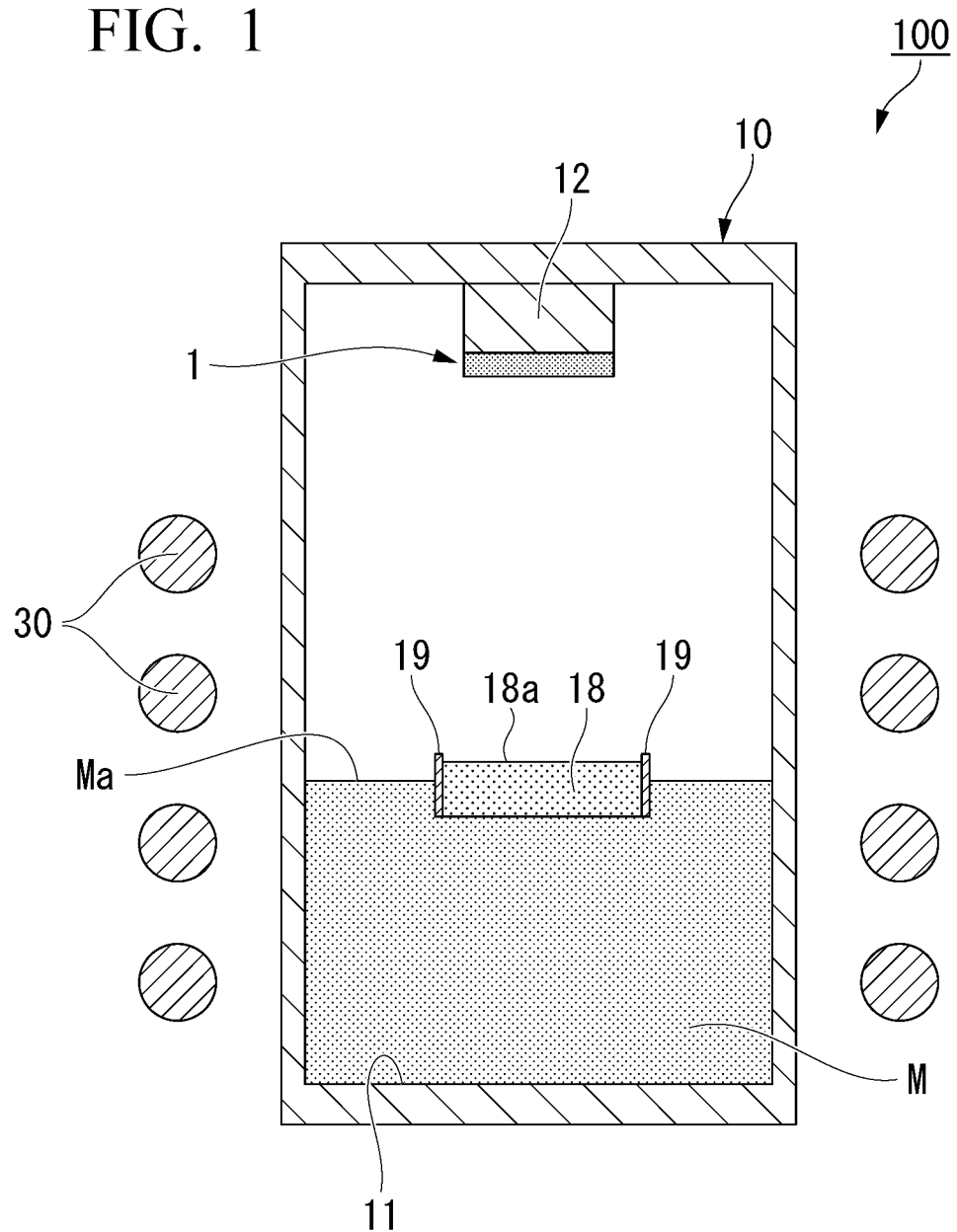
FIG. 1 is a schematic view for explaining a single crystal growth method according to a first embodiment.

Hereinafter, the present embodiment will be described in detail with reference to the drawings as appropriate. In the drawings used in the following description, for the sake of convenience, the characteristic parts may be enlarged and shown, and the dimensional ratio of each component may be different from the actual one. Materials, dimensions, or the like exemplified in the following description are merely examples, and the present invention is not limited to them, and can be appropriately changed and implemented without changing the gist of the invention.

"Single Crystal Growth Method"

First Embodiment

FIG. 1 is a schematic view for explaining the single crystal growth method according to the first embodiment. First, a single crystal growth apparatus 100 used for the single crystal growth method will be described. The single crystal growth apparatus 100 shown in FIG. 1 has a crucible 10 and a heating device 30. In FIG. 1, the internal structure of the crucible 10 is also illustrated.

The crucible 10 is a container surrounding an internal space. The crucible 10 includes an inner bottom 11 and a crystal mounting part 12 opposed to the inner bottom 11. A raw material M is provided in the inner bottom 11. A seed crystal 1 is mounted in the crystal mounting part 12. For example, the crystal mounting part 12 protrudes toward the raw material M cylindrically at a central position as viewed from the raw material M side. For the crystal mounting part 12, a carbon material such as graphite can be used.

The heating device 30 covers the outer periphery of the crucible 10. For example, a coil can be used as the heating device 30. When a current is supplied to the coil, an induced current is generated in the crucible 10, and as a result, the raw material M is heated.

The single crystal growth method according to the first embodiment uses the single crystal growth apparatus 100 described above. Hereinafter, a single crystal growth method using the single crystal growth apparatus 100 will be described. The single crystal growth method according to the first embodiment includes a raw material-providing step, a covering step, and a crystal growing step.

In the raw material-providing step, the raw material M is provided in the inner bottom 11 of the crucible 10. For example, a powder raw material of SiC is filled in the inner bottom 11. It is preferable that the raw material surface Ma of the raw material M be leveled in order to enhance the symmetry with respect to the crystal mounting part 12. The average particle diameter of the provided SiC powder raw material is preferably 0.05 mm or more and 1.0 mm or less.

In the covering step, at least a part of the raw material surface Ma of the raw material M is covered with a metal carbide powder 18.

The metal carbide powder 18 is, for example, a transition metal carbide such as tantalum carbide (TaC), tungsten carbide (WC), niobium carbide (NbC), molybdenum carbide (MoC), hafnium carbide (HfC) or the like. These materials are excellent in heat resistance and stability. Further, these materials are materials which are less likely to adsorb and generate SiC than the raw material M, and can prevent the formation of crystal nuclei of SiC which is a starting point of recrystallization. Although the raw material particles can also be a starting point of recrystallization, the covering step by using the metal carbide powder 18 prevents exposure to the raw material gas and suppresses the generation of depositions accompanying the recrystallization.

The average particle diameter of the metal carbide powder 18 is preferably larger than the average particle diameter of the SiC powder material that constitutes the material M. The average particle diameter of the metal carbide powder 18 is preferably, for example, 0.1 mm or more and 2.0 mm or less. When the average particle diameter is 0.1 mm or more, the metal carbide powder is suppressed from being rolled up by the convection generated in the crucible 10 or the like. In addition, a sufficient space is provided between the particulars of the metal carbide powder 18, and the source gas sublimated from the source M is efficiently supplied to the seed crystal 1.

Preferably, the metal carbide powder 18 covers the central area of the raw material surface Ma. The central area is an area of 20 area % from the center of the raw material surface Ma. A plan view shape of the central area is similar to a plan view shape of the raw material surface Ma.

The temperature of the central area of the crucible 10 is lower than that of the peripheral area. Therefore, recrystallization of the source gas is more likely to occur in the central area than in the outer peripheral area. The central area in which recrystallization easily occurs is covered with the metal carbide powder 18; and the peripheral area in which the raw material M is easily sublimated is not covered with the metal carbide powder 18. As a result, the source gas can be efficiently supplied to the seed crystal 1.

It is desirable that the metal carbide powder 18 cover an area in which the temperature is at least 15° C. lower than the maximum temperature in the surface of the raw material. In the raw material surface Ma, when an area in which the temperature is at least 20° C. lower than the maximum temperature in the raw material surface is formed, the deposition is easily generated on the area of the raw material surface Ma. When the area in which the raw material surface Ma is covered with the metal carbide powder 18 is increased, the deposition-preventing effect is enhanced. On the other hand, when the area in which the raw material surface Ma is covered with the metal carbide powder 18 is increased too much, the flow of the sublimation gas to the seed crystal may be inhibited. The covering amount of the material surface Ma of the metal carbide powder can be appropriately set in accordance with the required specifications.

The metal carbide powder 18 may cover a wider area than the central area. For example, the deposition preventing member 13 may cover the area of 50 area % or more of the inner bottom 11 from the center, and may cover the area of 80 area % or more of the inner bottom 11 from the center.

When the metal carbide powder 18 covers only a part of the raw material surface Ma, a partition plate 19 may be used to divide the area to be covered. By using the partition plate 19, the height position of the raw material surface Ma and the height position of the surface 18a of the metal carbide powder 18 can be changed. The height positions of the raw material surface Ma and the surface 18a of the metal carbide powder 18 may be the same or different. The surface 18a of the metal carbide powder 18 is preferably in a range within 20 mm from the raw material surface Ma. The surface 18a of the metal carbide powder 18 may be located above the material surface Ma (on the side of the crystal mounting portion 12) or may be located below (on the inside bottom 11).

Examples of the partition plate 19 include, for example, a ring-shaped structure made of graphite or metal carbide.

Figure 2:
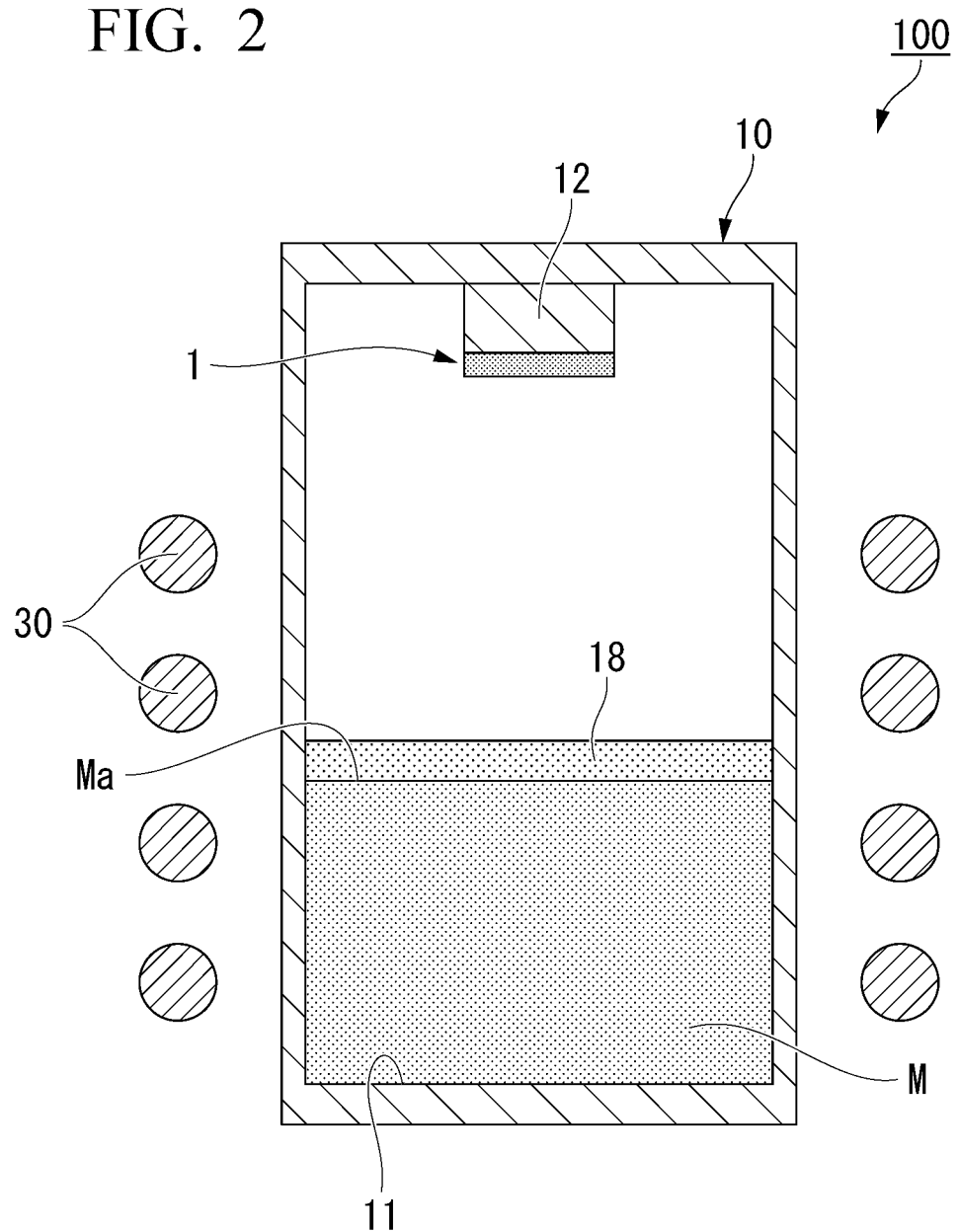
FIG. 2 is a schematic view for explaining another example of the single crystal growth method according to the first embodiment.

The metal carbide powder 18 may also cover the entire surface of the raw material M, as shown in FIG. 2. The source gas sublimated from the source M reaches the seed crystal 1 through the space between the particulars of the metal carbide powder 18.

It is preferable that the average thickness of the covering area made of metal carbide powder 18 be 1.0 mm or more and 30 mm or less. By setting the average thickness of the covering area to a predetermined range, it is possible not only to suppress the recrystallization of the source gas on the source surface Ma, but also to allow the source gas to be used efficiently as the seed crystal 1.

The surface of the metal carbide powder 18 may be smoothed or may have a protruded mountain shape toward the center of the crucible 10.

Next, the seed crystal 1 is placed in the crystal mounting part 12 at a position facing the raw material M. Mounting the seed crystal 1 may be performed before or after the raw material M is provided. After providing the seed crystal 1 and the raw material M, the crucible 10 is sealed.

In the crystal-growing step, heating is performed by the heating device 30. For example, a current is supplied into the coil. An induced current from the coil is generated in the crucible 10 to generate heat. The raw material M is sublimated by heating the crucible 10 and recrystallized on the surface of the seed crystal 1 so that the seed crystal 1 grows.

According to the single crystal growth method of the first embodiment, the source gas subjected to sublimation can be prevented from recrystallizing on the raw material surface Ma, and the occurrence of different polytypes in the single crystal to be grown can be suppressed.

The crucible 10 is heated by the coil 30 from the outside. The temperature in the central area of the crucible 10 is lower than the outside. Sublimation of the raw material M contained in the crucible 10 mainly occurs in the outer peripheral area of the crucible 10. The outer peripheral area means an area inside the crucible 10 and outside the central area. In the absence of the metal carbide powder 18, a portion of the source gas sublimated in the outer peripheral area grows crystals using the source particles located in the central area as nuclei. The crystal, which is obtained by recrystallized using the raw material particle as nuclei, remains as deposition on the raw material surface after crystal growth. In order to stably grow the single crystal, it is necessary to stabilize the Si/C ratio of the sublimation gas in the growth space. The deposition phenomenon of the raw material surface is considered to destabilize this N/C ratio and cause the generation of different polytypes.

On the other hand, when the metal carbide powder 18 covers the raw material surface Ma, the generation of depositions is suppressed. The metal carbide powder 18 is made of metal carbide, for which it is difficult to adsorb and form SiC. Therefore, recrystallization of the sublimated source gas on the metal carbide powder 18 is also suppressed. That is, the single crystal growth apparatus 100 according to the first embodiment not only suppresses the generation of deposition, but also suppresses the generation of different polytypes in the single crystal for crystal growth.

Also, the size of the covered area made of the metal carbide powder 18 can be freely adjusted. When it is a member with a certain shape, there are restrictions such as processing the member with a large size, but when it is a powder, there are few restrictions.

As mentioned above, although examples of preferred embodiments of the present invention have been described in detail, the present invention is not limited to this embodiment, and within the scope of the subject matter of the present invention described in the claims, various modifications and changes are possible.

EXAMPLE

Example 1

First, a crystal growth crucible in which a cylindrical internal space was provided was prepared. Then, the inner bottom of the crystal growth crucible was filled with the powdered SiC powder as a raw material. Then, a tantalum carbide powder was placed on the filled SiC powder material. The tantalum carbide powder covered the central area of the raw material.

Then, a 4H-SiC seed crystal was placed in the crystal mounting part to grow a 6-inch SiC ingot. The produced SiC ingots were all 4H-SiC and did not contain different polytypes. Also, no deposition was observed on the tantalum carbide powder placed.

Comparative Example 1

Comparative Example 1 is different from Example 1 in that tantalum carbide powder was not used. That is, the crystal growth of the SiC ingot was carried out without covering the raw material surface. The other conditions were the same as in Example 1 to carry out crystal growth of the single crystal.

The produced SiC ingot contained different polytypes of 6H-SiC and rhombohedral 15R-SiC in 4H-SiC. Moreover, many depositions were confirmed on the raw material surface.

DESCRIPTION/EXPLANATION OF REFERENCES

1: Seed crystal
10: Container
11: Inner bottom
12: Crystal mounting part
18: Metal carbide Powder
18a: Surface
19: Partition plate
30: Coils (heating device)
100: Single crystal growth apparatus
M: Raw material
Ma: Raw material surface

What is claimed is:

1. A single crystal growth method, which is carried out in a crucible comprising an inner bottom for providing a raw material and a crystal mounting part facing the inner bottom, the method comprising in the following order:
   providing the raw material in the inner bottom;
   covering a part but not the entire surface of the raw material with a metal carbide powder in a plan view from the crystal mounting part; and
   growing a single crystal disposed in the crystal mounting part by sublimating the raw material by heating,
   wherein in the covering step, an area covered with the metal carbide powder includes a central area of the surface of the raw material, and
   the central area is an area of 20 area % of the total surface area in plan view at a top surface of the raw material from a center of the surface of the raw material.

2. The single crystal growth method of claim 1,
   wherein a particle diameter of the metal carbide powder is 0.1 mm or more and 2.0 mm or less.

3. The single crystal growth method of claim 1,
   wherein the metal carbide powder is a tantalum carbide powder.

4. The single crystal growth method according to claim 1,
   wherein an average thickness of a covered area made of the metal carbide powder in the covering step is 1.0 mm or more and 30 mm or less.

5. The single crystal growth method of claim 1,
   wherein the temperature of the central area is lower than that of a peripheral area.

6. The single crystal growth method of claim 1, wherein a temperature of the central area is at least 15° C. lower than a maximum temperature in the surface of the raw material.

7. The single crystal growth method of claim 1, wherein a partition plate is used to divide the area to be covered.

8. The single crystal growth method of claim 1, wherein a surface of the metal carbide powder is in a range within 20 mm from the raw material surface.

\* \* \* \* \*